United States Patent
Chiu et al.

(10) Patent No.: US 7,782,217 B2
(45) Date of Patent: Aug. 24, 2010

(54) SYSTEM AND METHOD FOR MONITORING MOTOR

(75) Inventors: Tsung-Je Chiu, Taipei Hsien (TW); Wan-Neng Su, Taipei Hsien (TW); Po-Tse Huang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 469 days.

(21) Appl. No.: 11/947,069

(22) Filed: Nov. 29, 2007

(65) Prior Publication Data

US 2008/0278341 A1 Nov. 13, 2008

(30) Foreign Application Priority Data

May 8, 2007 (CN) .................. 2007 1 0200586

(51) Int. Cl.
*G08B 21/00* (2006.01)
*G05B 1/06* (2006.01)

(52) U.S. Cl. .................. 340/648; 340/635; 340/657; 340/661; 318/638

(58) Field of Classification Search .................. None
See application file for complete search history.

(56) References Cited

U.S. PATENT DOCUMENTS

| | | | | |
|---|---|---|---|---|
| 4,625,309 A | * | 11/1986 | Nitschke | 714/23 |
| 4,746,845 A | * | 5/1988 | Mizuta et al. | 318/286 |
| 5,270,640 A | * | 12/1993 | Kohler et al. | 324/772 |
| 5,638,307 A | * | 6/1997 | Kamimura et al. | 713/321 |
| 2005/0206338 A1 | | 9/2005 | Tsai | |
| 2007/0257807 A1 | * | 11/2007 | Darr | 340/635 |
| 2009/0134823 A1 | * | 5/2009 | Jeung | 318/400.18 |

* cited by examiner

*Primary Examiner*—Julie Lieu
(74) *Attorney, Agent, or Firm*—Jeffrey T. Knapp

(57) ABSTRACT

A system (100) for monitoring a motor (202) includes a potential-detecting module (102), a potential-comparing module (104) and a motor-monitoring module (106). The potential-detecting module is configured for measuring output potential of the motor before operation of the motor, and measuring output potential during operation of the motor so as to determine a first output potential and a second output potential. The potential-comparing module is configured for comparing the first output potential with the second output potential to determine whether the motor is operating normally. The motor-monitoring module is configured for selecting a monitoring type if the motor is operating normally. A method for monitoring a motor is also provided.

18 Claims, 5 Drawing Sheets

SYSTEM AND METHOD FOR MONITORING MOTOR

BACKGROUND

1. Field of the Invention

The present invention relates to motors and, particularly, to a system for monitoring a motor and a method for monitoring the same.

2. Description of Related Art

To avoid causing damage to components in electrical devices (e.g., personal computers, and projectors etc.,) due to high operating temperatures, a cooling system needs to be installed. A general type of cooling system is a fan cooling system. A fan cooling system includes fans each with fan blades and a motor for driving the fan blades to rotate. The fans are installed adjacent to those electrical components needing to be cooled.

To ensure normal operation of the fan cooling system, motors should be stable. Therefore, a system for monitoring operation of the motors is needed.

In practical use, there are two types of systems for monitoring operation of motors according to motor type: one type is level feedback system for level feedback motors and the other type is pulse feedback system for pulse feedback motors.

If a motor used in the fan cooling system is replaced with a different type of motor then the monitoring system needs to be changed as well. Therefore, firmware (including hardware and software) in these electrical devices has to be modified to meet the change of the monitoring system. This increases the cost of the fan cooling system.

What is needed, therefore, is to provide a system and a method for monitoring the motor that doesn't need firmware modification even if the motor is replaced by another type.

SUMMARY

In a present embodiment, a system for monitoring a motor includes a potential-detecting module, a potential-comparing module and a motor-monitoring module. The potential-detecting module is configured for measuring output potential of the motor before operation of the motor, and measuring output potential during operation of the motor so as to determine a first output potential and a second output potential. The potential-comparing module is configured for comparing the first output potential with the second output potential to determine whether the motor is operating normally. The motor-monitoring module is configured for selecting a monitoring type if the motor is operating normally.

In another present embodiment, a method for monitoring a motor, the method comprising the steps of: measuring output potential of the motor before operation of the motor and measuring output potential of the motor during operation of motor so as to determine a first output potential and a second output potential; comparing the first output potential with the second output potential to determine whether the motor is operating normally; and selecting a monitoring type for monitoring motor if the motor is operating normally.

Advantages and novel features will become more apparent from the following detailed description of the present system and present method for monitoring the motor, when taken in conjunction with the accompanying drawings.

BRIEF DESCRIPTION OF THE DRAWINGS

Many aspects of the present system and present method for monitoring a motor can be better understood with reference to the following drawings. The components in the drawings are not necessarily drawn to scale, the emphasis instead being placed upon clearly illustrating the principles of the present system and present method for monitoring a motor. Moreover, in the drawings, like reference numerals designate corresponding parts throughout the several views.

Figure 1:
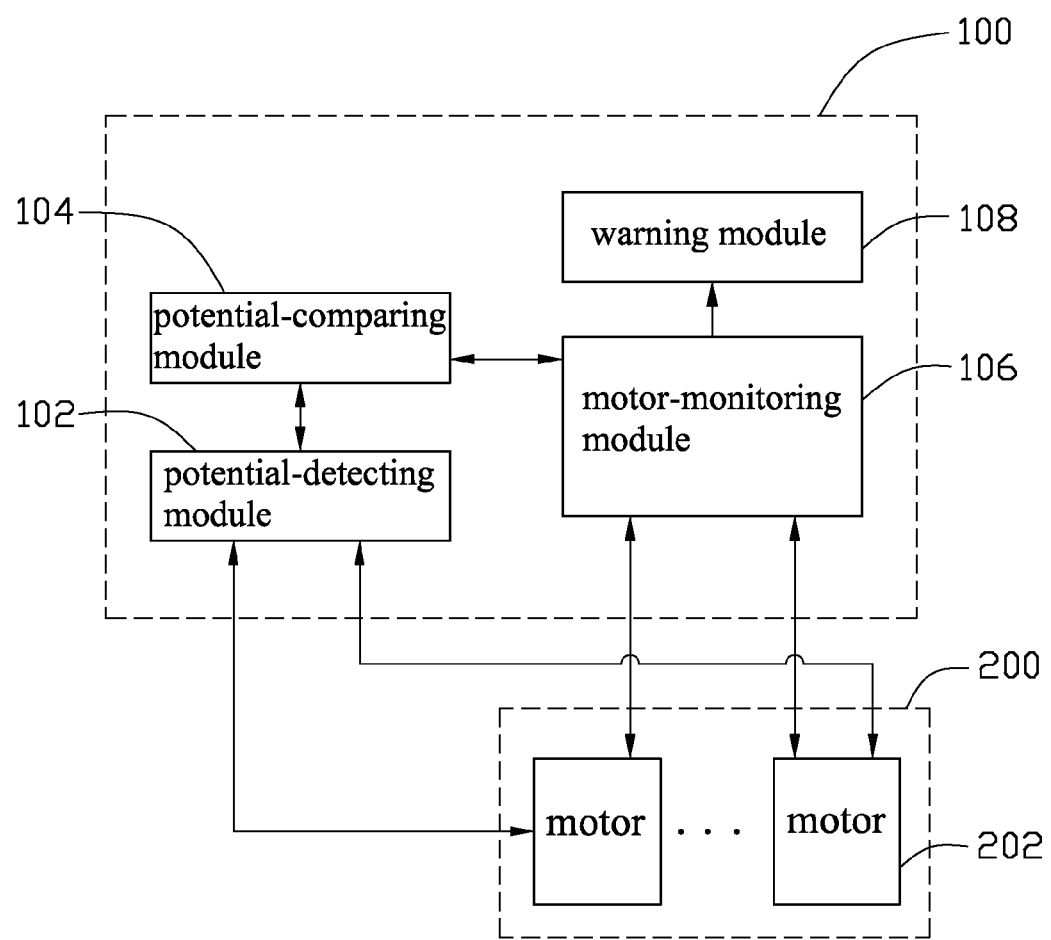
FIG. 1 is a block diagram of software function modules of a system for monitoring a motor according to a first present embodiment.

Corresponding reference characters indicate corresponding parts throughout the drawings. The exemplifications set out herein illustrate at least one preferred embodiment of the present system and present method for monitoring the motor, in one form, and such exemplifications are not to be construed as limiting the scope of the invention in any manner.

DETAILED DESCRIPTION OF THE INVENTION

Reference will now be made to the drawings to describe at least one preferred embodiment of the present system and present method for monitoring a motor.

Referring to FIG. 1, a system 100 for monitoring motors, according to a first present embodiment, is shown. The system 100 includes a potential-detecting module 102, a potential-comparing module 104, and a motor-monitoring module 106. The system 100 is configured for monitoring operation of a motor group 200 including a plurality of motors 202.

The potential-detecting module 102 is configured for measuring output potential of the motors 202 before operation of the motors 202 and measuring output potential of the motors 202 during operation of the motors 202. The potential-comparing module 104 is configured for comparing the detected output potentials of the motors and determining whether the motors 202 are operating normally. The motor-monitoring module 106 is configured for selecting a monitoring type (e.g., a level feedback type or a pulse feedback type) if the motors 202 are operating normally.

Further, the system 100 includes a warning module 108. The warning module 108 is configured for sending out a warning (e.g., an audible warning) if one or more of the motors 202 is not operating normally.

Figure 2:
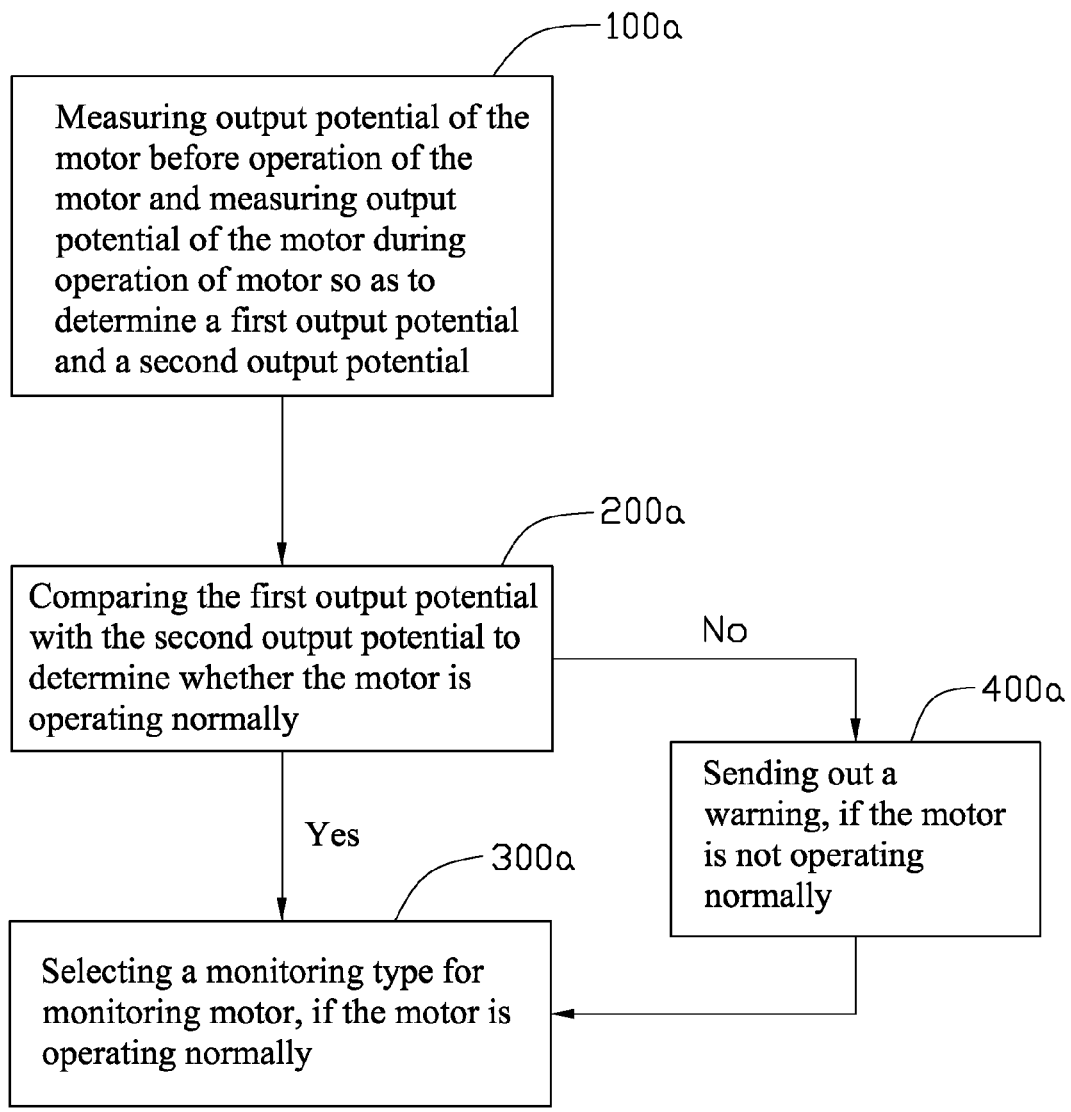
FIG. 2 is a flow chart of a method for monitoring a motor according to a second present embodiment.

Referring to FIG. 2, a method for monitoring a motor, according to a second present embodiment, is shown. The motor may be one of the motors 202 included in the motor group 200 (as shown in FIG. 1). The method is used in the system 100 of the first present embodiment. The method includes the steps of:

measuring output potential of the motor before operation of the motor and measuring output potential of the motor during operation of motor so as to determine a first output potential and a second output potential, shown as step 100*a*;

comparing the first output potential with the second output potential to determine whether the motor is operating normally, shown as step 200*a*;

selecting a monitoring type for monitoring motor, if the motor is operating normally, shown as step 300*a*; and sending out a warning, if the motor is not operating normally, shown as step 400*a*.

In the step 100a, original potential V of the motor circuit is high. The potential-detecting module 102 detects output potentials of the motor 202 before and during operation of the motor 202 so as to determine a first output potential V1 and a second output potential V2. It is understood that the first output potential V1 detected before operation of the motor 202 is the same as the original potential V. During operation of the motor 202, the second output potential V2 is detected by the potential-detecting module 102.

Figure 3:
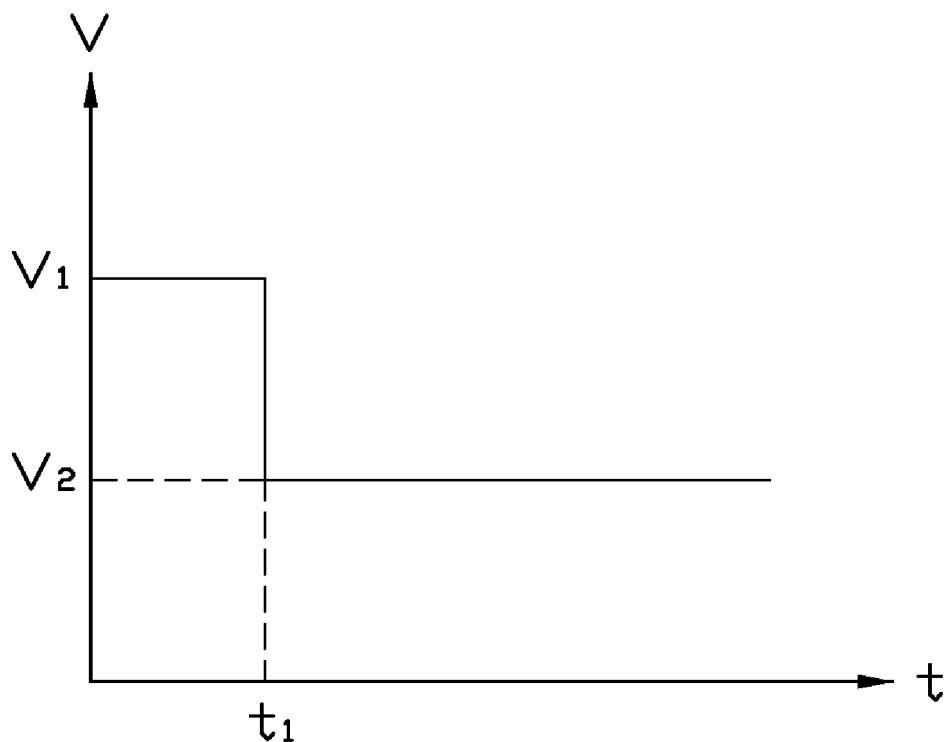
FIG. 3 is a first relationship between an output potential and time according to the second present embodiment.
Figure 4:
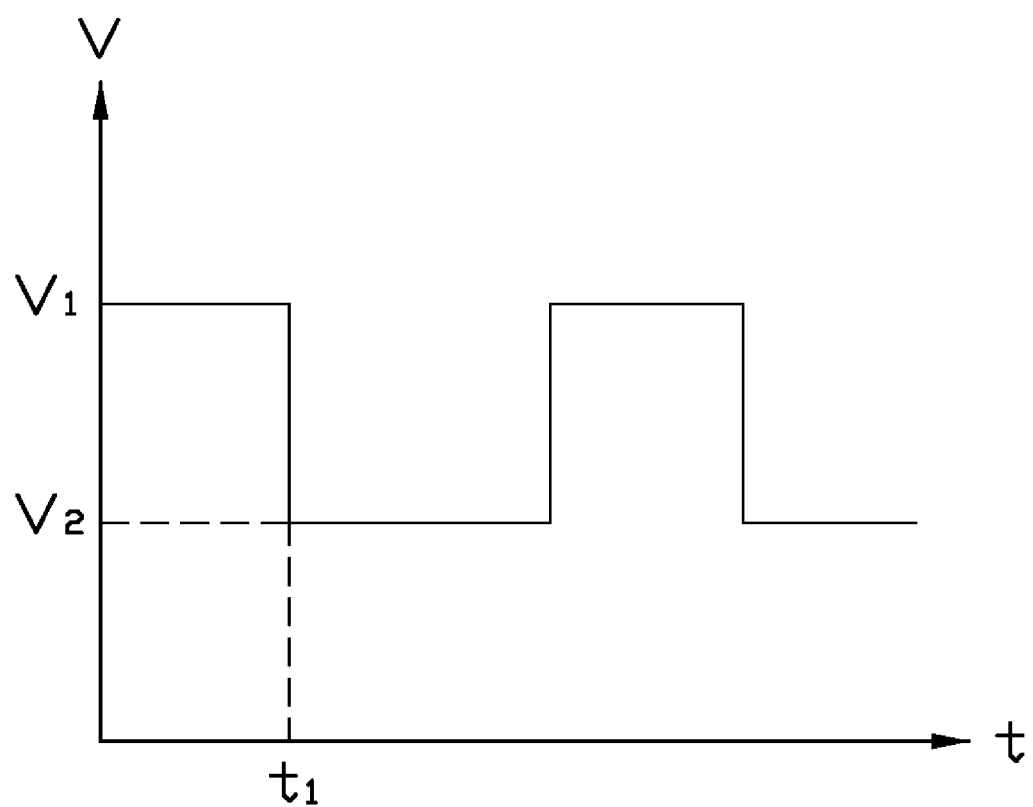
FIG. 4 is a second relationship between an output potential and time according to the second present embodiment.
Figure 5:
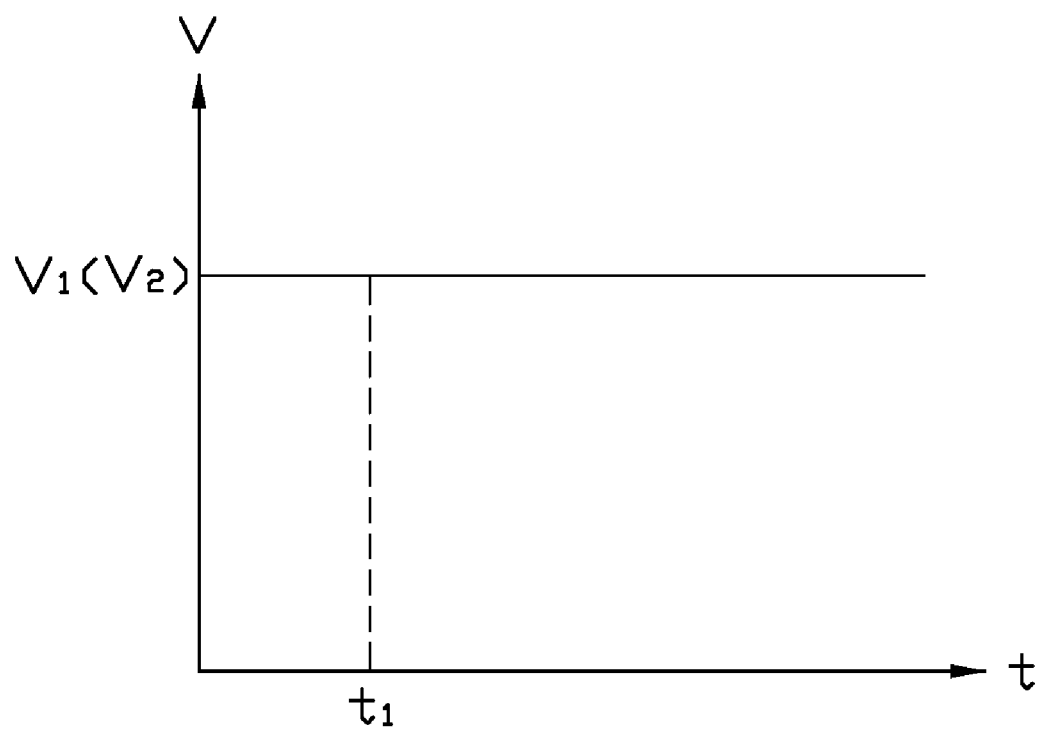
FIG. 5 is a third relationship between an output potential and time according to the second present embodiment.

In the step 200a, the first output potential V1 is compared with the second output potential V2 by the potential-comparing module 104 to determine whether the motor 202 is operating normally. In this present embodiment, operation of the motor 202 is started at a time t1, as shown in FIGS. 3, 4 and 5. If the motor 202 is operating normally, the detected potential before operation of the motor 202 is different from the detected potential during operation of the motor 202. Therefore, if the comparison indicates that the first output potential V1 of the motor 202 is different from the second output potential V2 of the motor 202, as shown in FIGS. 3 and 4, the motor 202 is operating normally. If the comparison indicates that the first output potential V1 of the motor 202 is the same as the second output potential V2 of the motor 202, as shown in FIG. 5, the motor 202 is not operating normally.

In the step 300a, the first output potential V1 before the time t1 is different from that the second output potential V2 after the time t1, as shown in FIGS. 3 and 4. In this way, as mentioned above, the motor 202 is operating normally. After that, the motor-monitoring module 106 selects a monitoring type for monitoring operation of the motor 202. The monitoring type includes a level feedback type and a pulse feedback type. In the level feedback type, the detected output potential is changed one time from the first output potential to the second output potential. In the pulse feedback type, the detected output potential is changed multi-times between the first output potential and the second output potential. Therefore, if the detected output potential is changed one time from the first output potential to the second output potential, as shown in FIG. 3, then a level feedback type is selected. If the detected output potential is changed multi-times between the first output potential and the second output potential, as shown in FIG. 4, then a pulse feedback type is selected.

Referring to FIG. 5, in the step 400a, operation of one of the motors 202 is started at time t1, if the motor 202 is not operating normally (e.g., the motor is broken), the detected output potential after the time t1 (understood as the second output potential V2) is the same as that before the time t1 (understood as the first output potential V1). Therefore, if the first output potential V1 is the same as the second output potential V2, the motor is not operating normally. In this situation, the motor-monitoring module 106 controls the warning module 108 to send out a warning (e.g., an audible warning) so that user can be aware of this situation. The user may replace the motor 202. After the replacement, the motor-monitoring type is selected according to the steps 100a to 300a.

Since the output potentials before and during operation of the motor are detected and compared, the motor-monitoring type is selected according to the comparison. Therefore, even if the motor type is changed, firmware modification to the cooling system can be avoided. This complies with the requirement for reduced expense.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A system for monitoring a motor comprising:
    a potential-detecting module configured for measuring output potential of the motor before operation of the motor, and measuring output potential during operation of the motor so as to determine a first output potential and a second output potential;
    a potential-comparing module configured for comparing the first output potential with the second output potential to determine whether the motor is operating normally; and
    a motor-monitoring module configured for selecting a monitoring type if the motor is operating normally.

2. The system as claimed in claim 1, wherein the first output potential is defaulted high.

3. The system as claimed in claim 2, wherein the potential-comparing module determines the motor is operating normally, if the first output potential is different from the second output potential.

4. The system as claimed in claim 2, wherein the potential-comparing module determines the motor is not operating normally, if the first output potential is same as the second output potential.

5. The system as claimed in claim 3, wherein the monitoring type is one of a level feedback type and a pulse feedback type.

6. The system as claimed in claim 5, wherein the level feedback type is selected, if the detected output potential is changed one time from the first output potential to the second output potential during operation of the motor.

7. The system as claimed in claim 5, wherein the pulse feedback type is selected, if the detected output potential is changed multi-times between the first output potential and the second output potential during operation of the motor.

8. The system as claimed in claim 4, further comprising the warning module configured for sending out a warning if the motor is not operating normally.

9. A method for monitoring a motor, the method comprising the steps of:
    measuring output potential of the motor before operation of the motor and measuring output potential of the motor during operation of motor so as to determine a first output potential and a second output potential;
    comparing the first output potential with the second output potential to determine whether the motor is operating normally; and
    selecting a monitoring type for monitoring motor if the motor is operating normally.

10. The method as claimed in claim 9, wherein the first output potential is defaulted high.

11. The method as claimed in claim 10, wherein operation of the motor is determined to be normal, if the first output potential is different from the second output potential.

12. The method as claimed in claim 10, wherein operation of the motor is determined to be not normal, if the first output potential is same as the second output potential.

13. The method as claimed in claim 11, wherein the monitoring type is one of a level feedback type and a pulse feedback type.

14. The method as claimed in claim 13, wherein the level feedback type is selected, if the detected output potential is changed one time from the first output potential to the second output potential during operation of the motor.

15. The method as claimed in claim 13, wherein the pulse feedback type is selected, if the detected output potential is changed multi-times between the first output potential and the second output potential during operation of the motor.

16. The method as claimed in claim 12, further comprising a step of sending out a warning if the motor is not operating normally.

17. A system for monitoring a motor comprising:
- a potential-detecting module configured for measuring output potential of the motor before operation of the motor to determine a first output potential, and measuring output potential during operation of the motor to determine a second output potential;
- a potential-comparing module configured for comparing the first output potential with the second output potential to determine whether the motor is operating normally, wherein the potential-comparing module determines the motor is operating normally if the first output potential is different from the second output potential; and
- a motor-monitoring module configured for selecting a monitoring type according to switching times of the measured output potential between the first output potential and the second output potential during operation of the motor, if the motor is operating normally.

18. The system as claimed in claim 17, wherein the monitoring type is one of a level feedback type and a pulse feedback type, the level feedback type is selected if the measured output potential is changed one time from the first output potential to the second output potential during operation of the motor, and the pulse feedback type is selected if the measured output potential is changed multi-times between the first output potential and the second output potential during operation of the motor.

* * * * *